US006779140B2

(12) United States Patent
Krech, Jr. et al.

(10) Patent No.: US 6,779,140 B2
(45) Date of Patent: Aug. 17, 2004

(54) ALGORITHMICALLY PROGRAMMABLE MEMORY TESTER WITH TEST SITES OPERATING IN A SLAVE MODE

(75) Inventors: Alan S Krech, Jr., Fort Collins, CO (US); Edmundo De La Puente, Cupertino, CA (US); Joel Buck-Gengler, Longmont, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 378 days.

(21) Appl. No.: 09/896,474

(22) Filed: Jun. 29, 2001

(65) Prior Publication Data

US 2003/0005375 A1 Jan. 2, 2003

(51) Int. Cl.[7] .............................................. G11C 29/00
(52) U.S. Cl. ...................... 714/718; 709/400; 713/400; 324/765
(58) Field of Search ................... 714/718; 324/765; 709/400; 713/400

(56) References Cited

U.S. PATENT DOCUMENTS 4,639,919 A * 1/1987 Chang et al. ............... 714/743
5,805,610 A * 9/1998 Illes et al. .................. 714/738
6,028,439 A * 2/2000 Arkin et al. ................ 324/765
6,223,228 B1 * 4/2001 Ryan et al. ................. 709/400

* cited by examiner

Primary Examiner—Albert Decady
Assistant Examiner—John P. Trimmings
(74) Attorney, Agent, or Firm—Edward L. Miller

(57) ABSTRACT

A Test Station for a memory tester is comprised of one or more Test Sites that are each individually algorithmically controllable, that can each deal with as many as sixty-four channels, and that can be bonded together to form a Multi-Site Test Station of two or more Test Sites. Up to nine Test Sites can be bonded together as a single Multi-Site Test Station. Bonded Test Sites still operate at the highest speeds they were capable of when not bonded. To bring this about it is necessary to implement certain programming conventions and to provide certain housekeeping functions relating to simultaneous starting of separate test programs on the bonded Test Sites, and relating to propagation and synchronization of test program qualifier results among those separate test programs. There also is a suspend/resume test program execution mechanism that assists one test program in temporarily interrupting the others to allow time for a change within one or more of the Test Sites of a measurement parameter, such as a voltage comparison threshold.

9 Claims, 6 Drawing Sheets

US 6,779,140 B2

ALGORITHMICALLY PROGRAMMABLE MEMORY TESTER WITH TEST SITES OPERATING IN A SLAVE MODE

REFERENCE TO RELATED APPLICATION

The subject matter of this disclosure is also related to that in U.S. patent application Ser. No. 09/702, 631 now U.S. Pat. No. 6,687,861, filed Sep. 31, 2000 and entitled MEMORY TESTER WITH ENHANCED POST DECODE. In this Disclosure we make use of a signal called PD_ERROR that is central to the subject matter of an earlier filed case. And while we also give herein an abbreviated but sufficient account of what it means and of how it is generated, the complete details of the matter are considerably more complicated. As a hedge against the possibility that some confusion or seeming inconsistency may arise herein, and for brevity, we have accordingly chosen to incorporate MEMORY TESTER WITH ENHANCED POST DECODE herein by reference.

The subject matter of this disclosure is also related to that in U.S. patent application Ser. No. 09/677,202 now U.S. Pat. No. 6,671,844, filed Oct. 2, 2000 and entitled MEMORY TESTER TESTS MULTIPLE DUT'S PER TEST SITE. In this Disclosure we make reference to a certain collection of signals called FERR, PERR and PD_ERROR. Their existence is central to the subject matter of one feature described herein, but their origin and original use is described in an earlier filed case. And while we also give herein an abbreviated but sufficient account of what they means and of how they are generated, the complete details of the matter are, as in the case above, considerably more complicated. Accordingly, we have again chosen to incorporate MEMORY TESTER TESTS MULTIPLE DUT'S PER TEST SITE herein by reference.

BACKGROUND OF THE INVENTION

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. Memory tester frequently run continuously, and test time is considered a major factor in the cost of the final part. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and facilitates the use of logical methods to isolate portions of the pattern that do not perform as expected. A test pattern that is generated algorithmically using instructions and commands that are repeated in programming loops consumes less space in tester memory. Accordingly, it is desirable to have algorithmic test pattern generation capability in a memory tester.

Precise signal edge placement and detection is also a consideration in the effectiveness of a non-volatile memory tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate "transmit" vectors that are applied (stimulus) to the DUT (Device Under Test), and "receive" vectors that are expected in return (response). The algorithmic logic that generates these vectors can generally do so without troubling itself about how a particular bit in a vector is to get to or from a particular signal pad in the DUT, as the memory tester contains mapping arrangements to route signals to and from pins.

Memory testers have interior test memory that is used to facilitate the test process. This interior test memory may be used for several purposes, among which are storing transmit vectors ahead of time, as opposed to generating them in real time, storing receive vectors, and storing a variety of error indications and other information concerning DUT behavior obtained during testing. (There are also housekeeping purposes internal to the operation of the memory tester that use SRAM and that may appear to fall within the purview of the phrase "interior memory." These are private to the internal operation of the tester, tend to not be visible at the algorithmic level, and are comparable to internal control registers. That memory is described as "interior control memory," and is excluded from what is meant herein by the term "interior test memory," which we use to describe memory used to store bit patterns directly related to the stimulus of, and response from, the DUT.) It is easy to appreciate that this interior test memory needs to operate at least as fast as the tests being performed; a very common paradigm is for the interior test memory (or some portion thereof) to be addressed by the same address (or some derivative thereof) as is applied to the DUT. What is then stored at that addressed location in interior test memory is something indicative of DUT behavior during a test operation performed on the DUT at that address. Algorithmic considerations within the test program may mean that the sequence of addresses associated with consecutive transmit vectors can be arbitrary. Thus, the interior memory needs to have the dual attributes of high speed and random addressability. SRAM comes to mind immediately as being fast, easy to control and tolerant of totally random addressing. Indeed, conventional memory testers have used SRAM as their interior test memory.

Unfortunately, SRAM is quite expensive, and this has limited the amount of interior test memory with which memory testers have had to work. The result is limits on memory tester functionality that are imposed by a shortage of memory. DRAM is significantly less expensive, but cannot tolerate random addressing and still perform at high speed.

DRAM can replace SRAM as the interior test memory in a memory tester. As briefly described in a simplified overview below, the problem of increasing the speed of DRAM operation for use as interior test memory can be solved by increasing the amount of DRAM used, in place of increasing its speed. Numbers of identical Banks of DRAM are treated as Groups. A combination of interleaving signals for different Banks of memory in a Group thereof and multiplexing between those Groups of Banks slows the memory traffic for any one Bank down to a rate that can be handled by the Bank. (For the reader's convenience, we include a very abbreviated summary of this technique here, since much of its architectural aspects and associated terminology are useful in the explanation of the inventive subject matter that follows.)

A three-way multiplexing between three Groups of four Banks each, combined with a flexible four-fold interleaving scheme for signal traffic to a Group produces an increase in operating speed approaching a factor of twelve, while requiring only three memory busses. A round robin strategy for choosing the next Group for the multiplexer is simple and assures that the interleaving mechanism for each Group has the time it needs to complete its most recently assigned task. All interleaved accesses within a Group are performed upon a next Bank (within that Group), also selected by a simple round robin selection. In this configuration, each of the twelve Banks represents a duplicate instance of the entire available address space, and any individual write cycle might end up accessing any one of the twelve Banks. An implication is that, at the conclusion of testing, all twelve Banks must be investigated to learn what failures happened during testing of the DUT, since the history of any address or collection of addresses of interest will be spread out across all twelve Banks. A particular channel is thus represented by twelve bits (one bit from each Bank and whose bit position within the word for that Bank is determined by the channel).

It would be, however, awkward to have to (manually, as it were) individually consult all twelve Banks to discover failure information, so a utility mechanism has been provided to automatically "compose" (merge) results of all twelve Banks during a read cycle at an address into a unified result that can be stored in one or all twelve Banks. This allows composed data to later be read at full speed.

At the top level of interior test memory organization there are four Memory Sets, each having its own separate and independent address space and performing requested memory transactions. Two are of DRAM as described above, and two are of SRAM. Each Memory Set has its own controller to which memory transactions are directed. As to externally visible operational capabilities, all four Memory Sets are essentially identical. They differ only in their size of memory space and how they are internally implemented: The SRAM Memory Sets do not employ multiplexing and interleaving, since they are fast enough to begin with.

The interior test memory of the tester is divided into four Memory Sets, two of which are "internal" SRAM's and two of which are "external" DRAM's. To be sure, all this memory is physically inside the memory tester; the terms "internal" and "external" have more to do with a level of integration. The SRAM's are integral parts of a VLSI (Very Large Scale Integration) circuit associated with the tester's central functional circuitry, while the DRAM's are individual packaged parts mounted adjacent the VLSI stuff. The amount of SRAM is fairly small, (say, around a megabit per Memory Set) while the amount of DRAM is substantial and selectable (say, in the range of 128 to 1024 megabits per Memory Set). The SRAM Memory Sets are always present, and may be used for any suitable purpose, such as storing the expected content of a DUT that is a ROM (Read Only Memory). The DRAM Memory Sets are actually optional, and are typically used for creating a trace for subsequent analysis leading to repair, although there are also other uses. The tester does not enforce a distinction between the SRAM and DRAM Memory Sets, as to different purposes for which they may be used. Those distinctions arise mostly as a matter of size. The SRAM Memory Sets are small, while the DRAM Memory Sets are potentially huge. The person or persons creating the test programming make the decisions concerning how the various Memory Sets are to be used.

We have said that the memory tester to described herein performs tests in an algorithmic fashion. The manner in which this is accomplished is by having a programmable mechanism upon which can execute a program that provides stimulus and response activity for the DUT. The programmatic nature of such a mechanism means that, for example, a sequence of addresses or data values can be operationally produced, at the time they are to be used, by arithmetic methods encoded in the program, rather than by simply being an entry in a long list that is traversed one step at a time, from its beginning to its end. For comparison purposes, that latter mode of operation is how a so-called "vector tester" operates.

And while it is sometimes possible to write a test program in a general fashion that allows specific configuration to be delayed until a later time (e.g. the number of address bits is n, n to be supplied either at compilation or at run time, or the width of the data path is k-many bits, and k is supplied later), once a DUT is on hand to be tested, everything is at once specific. A DUT is tested on what we shall term a "Test Site" that also has a specific collection of resources with which to perform testing. A memory tester may have a large number of Test Sites. A Test Site has its own programmable mechanism for executing code that performs algorithmic testing of a DUT. The usual way to describe the main attribute of a Test Site is by the number of electrical signals (pins, test points, or, to use the industry term, "channels") that can be involved in the testing process. Here, the word "involved" means one or both of "can be controlled" and "can be measured". An obvious issue that arises is how to deal with cases where the number of channels needed by a Test Site to test a particular DUT is not the same as the number of channels possessed by the Test Site.

If the number of channels possessed by a Test Site is normally sixty-four, and a particular DUT needs sixty, then that is a good match. If a DUT needs only thirty-two, then it would be desirable to somehow get two DUT's onto a single Test Site. That can be done (it's called Multi-DUT operation), but is not our present interest. Instead, we are presently concerned with the case where it takes one hundred twenty-eight or two hundred fifty-six channels to test a particular "BIG DUT". The usual solution for this situation in a vector machine is to simply have an appropriate list of vectors per Test Site and then simultaneously perform their operations in parallel. But then we still have vector machine, and are denied the advantages of using an algorithmic machine. We should like a way to bore a Test Site out to be bigger than it was made, and yet still preserve algorithmic control of the result.

What to do?

SUMMARY OF THE INVENTION

A Test Station for a memory tester is comprised of one or more Test Sites that are each individually algorithmically controllable, that can each deal with as many as sixty-four channels, and that can be bonded together to form a Multi-Site Test Station of two or more Test Sites. Up to nine Test Sites can be bonded together as a single Multi-Site Test Station. Bonded Test Sites still operate at the highest speeds they were capable of when not bonded. To bring this about it is necessary to implement certain programming conventions and to provide certain housekeeping functions relating to simultaneous starting of separate test programs on the bonded Test Sites, and relating to propagation and synchronization of test program qualifier results among those separate test programs. There also needs to be a suspend/resume test program execution mechanism that assists in temporary program interruption to allow time for a change within one or more of the Test Sites of a measurement parameter, such as a voltage comparison threshold.

DESCRIPTION OF A PREFERRED EMBODIMENT

Figure 1:
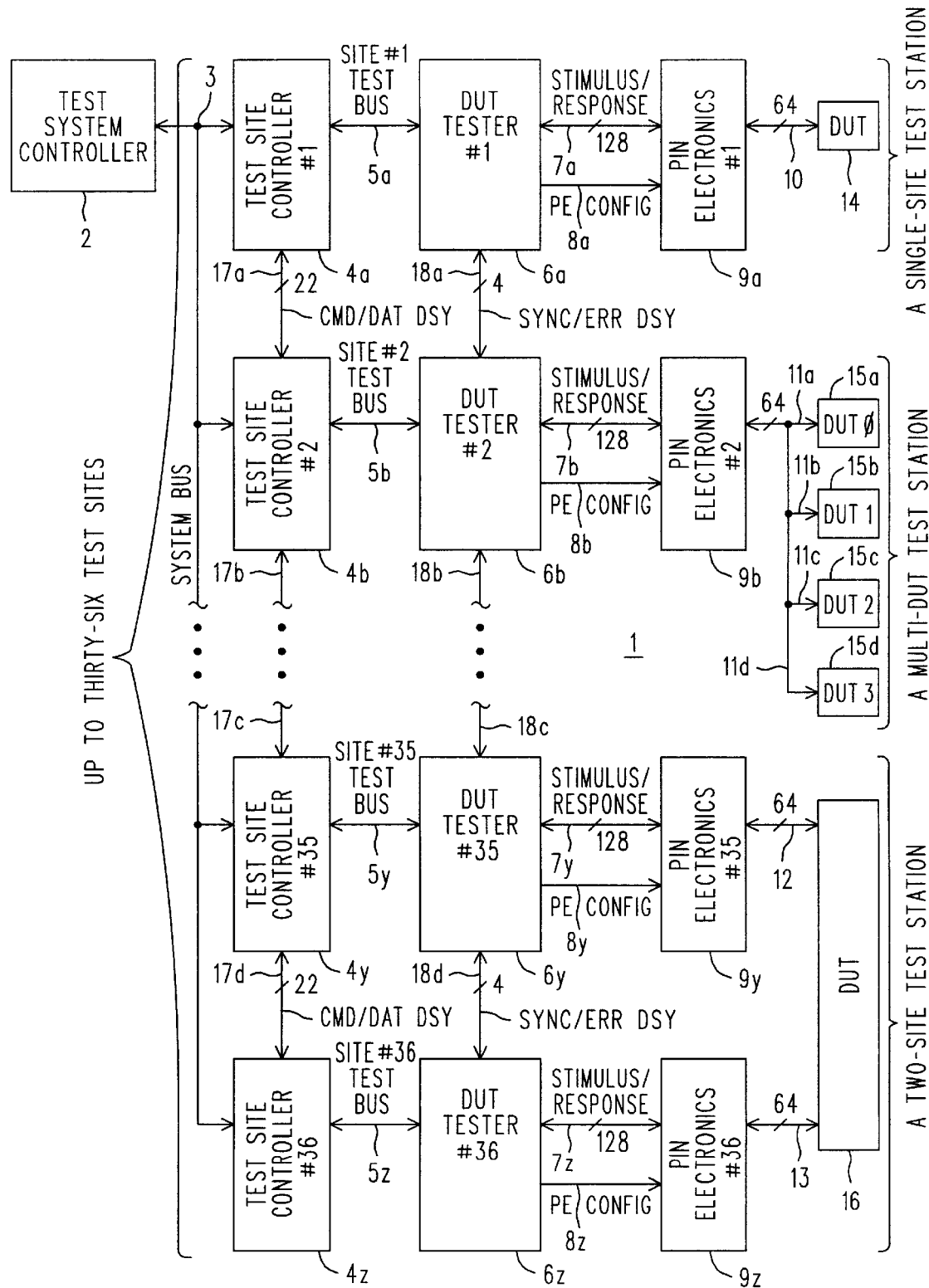
FIG. 1 is a simplified block diagram of an extensively reconfigurable and algorithmically driven non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight (or more) channels for testing a BIG DUT. Accordingly, and again in reference to an example shown in FIG. 1, we say that Test Sites #35 and #36 form a "two-Site Test Station". As we see below, there is a practical limit on the number of Test Sites bonded to form a Test Station. In the present embodiment it is nine. There could be four such Test Stations of nine Test Sites each, or greater numbers of smaller Test Stations, such as twelve Test Stations of three Test Sites each.

Figure 2:
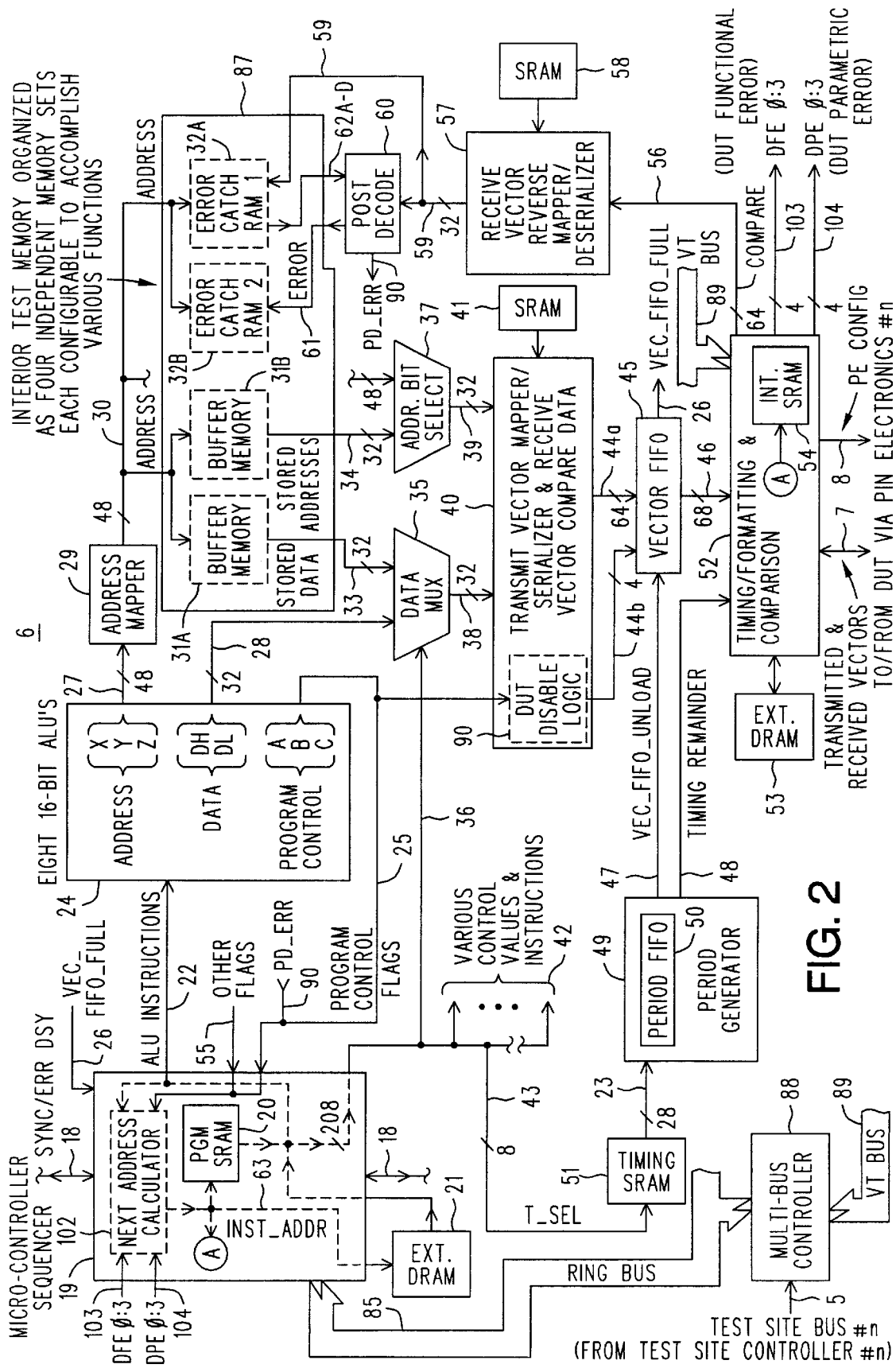
FIG. 2 is a simplified block diagram expansion of the DUT tester 6 of FIG. 1.

To briefly consider an opposing case, one should not assume that an entire Test Site is needed to test a single DUT, or that a single Test Site can test but a single DUT. Suppose that a wafer had two, three or four (probably, but not necessarily, adjacent) dies, the sum of whose test channel requirements were sixty-four channels or less. Such DUT's (15a–d) can be tested simultaneous by a single Test Site (e.g., Test Site #2 as shown in FIG. 2). What makes this possible is the general purpose programmability of each Test Site, as augmented by certain hardware features described in one of the incorporated Patents. In principle, a test program executed by the Test Site could be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. A major difference is, of course, individually keeping track of which of the two "component DUT's" pass or fail, as opposed to a simple unified answer for the "third" DUT. That is, there is an issue concerning what portion of the "third" DUT failed. There are other issues as well, including removing or limiting the drive signals to a bad DUT, branching within the test program based on which DUT indicates failure, while at the same time preventing the test program from becoming hopelessly multi-threaded. Certain simple aspects of this "Multi-DUT Test Station" capability at a single Test Site are fairly simple, while others are complex. Multi-DUT testing is not the subject of this Application, and should not be confused with the notion of bonding two or more Test Sites together to form a multi-site Test Station for the testing of a BIG DUT.

Were it not for this notion of Test Site reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were sometimes split to create more Test Stations for simple Multi-DUT testing (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, some as multi-DUT Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many DUT's can be tested on that Test Station. A Test Site Controller is an embedded system that may include an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that are to be written or are expected from a read operation, are generated as needed by a programmable algorithmic mechanism (called an APG) located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names). Patterns are executed by the APG, which stands for Automatic Program Generator.

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester 6 is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes going to the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment, and chilled water is cheaper than air conditioning to remove the several tens of KW of dissipated heat for a fully loaded system), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some "genuine" daisy chains incorporating some dedicated hardware as well as some busses used to create "pseudo" daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to help in the creation Master/Slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is REPLICATE'd onto a separate set of conductors before being passed on. It could be that way, but for performance reasons in the "BUS" case it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that, especially in the "genuine daisy chain hardware case," the daisy chains are high performance pathways for command and control information, and that if they were not, then we could not expect a Master/Slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that the "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Multi-Bus Controller 88 that converts traffic on the Test Site Bus to traffic on a Ring Bus 85 or a VT Bus 89. Ring Bus traffic can also converted to VT Bus traffic, and vice versa. Almost everything in FIG. 2 is part of some large scale integrated circuit; the Timing/Formatting & Comparison circuit 52 (described below) is actually eight such IC's, although we show it as one entity for the sake of brevity. Save for the various Ext. DRAM's (some of which are also part of the Interior Test Memory 87), most of the rest of the stuff in FIG. 2 is part of another large IC called the APG (Automatic Pattern Generator). The Ring Bus 85 is a general purpose inter-mechanism communication path for configuring the major elements within the APG portion of the DUT Tester 6, and for setting modes of operation, etc. There also various dedicated very wide and high speed paths between various elements of the APG. The VT Bus 89 is an IC to IC bus for use within the DUT Tester itself.

The Ring Bus 85 is the mechanism by which the Test Site Controller communicates with the APG portion of the DUT tester 6. The Ring Bus 85 is coupled to a Micro-Controller Sequencer 19, which may be likened to a special purpose microprocessor. Using an address created by a Next Address Calculator 102, it fetches instructions from a program stored in a program memory, which may be either internal to the Micro-Controller Sequencer 19 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is part of the large APG IC), so its size is limited. The external DRAM can be provided in adjustable amounts of considerable quantity, but is fast only when accessed in sequential chunks involving linear execution and no branching. Programming in the SRAM 20 is most often that which is intensely algorithmic, while the EXT. DRAM 21 is best suited for material not readily generated by algorithmic processes, such as initialization routines and random or irregular data.

The Next Address Calculator 102 can implement branching in the test program (pattern) being executed, in response to unconditional jump instructions or conditional jump or conditional subroutine instructions conditioned on various PROGRAM CONTROL FLAGS (25), OTHER FLAGS (55), and certain other signals that, for clarity are shown separately (DFE 0:3 103 and DPE 0:3 104) and which are provided for multi-DUT operation.

The instruction word fetched and executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address (created by Next Address Calculator 102) in ways familiar to those who understand about micro programmed execution mechanisms. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: PD_ERR 90. It is supplied to the PGM SRAM 20, originates with the Post Decode mechanism 60, and indicates that the Post Decode mechanism 60 has discovered an error.

Another such additional flag is VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a Group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for-bottom) mirror image of another section of circuitry. This has the effect of rearranging what the bits mean, as far as what sequential address values are in physical order within that circuitry. This chip layout property may occur many times, and it may well be the case that how one Group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to various Buffer Memories and/or Tag RAM's 31A–B and to Error Catch RAM1/2 (32A/B), which, while having separate functions, may nevertheless be implemented as selectable partitions in the four Memory Sets that are collectively the Interior Test Memory 87. The mapped address output 30 is also applied as one input to an Addr. Bit Select circuit 37, whose multiplexing function is described in due course. The Interior Test Memory can be configured to contain many instances of various RAM-based memory structures used for different functions. This is accomplished by declaring that certain portions of the different Memory Sets are to be used for the associated purposes. What is shown in FIG. 2 is one such arrangement; arrangements can be changed as testing proceeds, and this whole business of Memory Set usage should be considered to be very dynamic. None of the inhabitants of the Interior Test Memory (e.g., the error Catch RAM's 32A–B) are permanent hardware fixtures. What is permanent are the four Memory Sets. But which part of which Memory Set is an Error Catch RAM at any given time (if indeed there is even one defined) is dependent on whatever configuration has been established.

Consider the Buffer Memories 31A and 31B. Their functions are to retain data patterns 33 and addresses 34 that can be applied to the DUT. These are actual separate outputs from their associated Buffer Memories, although these Buffer Memories are not dual "port memories," but are preferably composed of portions of two different Memory Sets. In keeping with this, it is preferred that Stored Data 33 is kept in one Memory Set, while Stored Addresses 34 are kept in another. Also, we have not shown an explicit mechanism for writing to a Buffer Memory. One way that may be accomplished is by an addressed bus operation initiated by a Test Site Controller 4 at the behest of the program it is executing. There is an "under the floorboards," as it were, "utility services" bus called the Ring Bus 85 that goes to just about everything in FIG. 2 (most of the visitations of which are not shown—as that would clutter the drawing immensely).

The Error Catch RAM's 32A–B are addressed by the same address that is applied to the Buffer Memories, and they either store or retrieve information about errors, which operations are performed in conjunction with a Post Decode Circuit, to be discussed later. As with the paths 33 and 34 from the Buffer Memories 31A–B, paths 62A–D (from the Error Catch RAM1 32A) are preferably MUX'ed outputs from a portion of a Memory Set (configured to operate as an Error Catch RAM), in accordance with configuration information distributed by the Ring Bus (not shown).

Note that the Data MUX 35 has as inputs the STORED DATA output 33 from the Buffer Memory 31A as well as data 28 from the registers DH and DL in the collection 24 of ALU's. The Data MUX 35 performs an initial selection, in accordance with values 36 stored in PGM SRAM 20, of which of these inputs (28, 32) to present as its output 38, which, unless modified as described next, is then applied as one of two vector components to a Transmit Vector Mapper/ Serializer/Receive Vector Compare Data Circuit 40 (the other component is the output 39 of the Addr. Bit Select circuit 37).

Circuit 40 can perform three vector related functions: assemble vector components (38, 39) into an ordered logical representation of an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19.

Also contained within circuit 40 is a section of DUT Disable Logic 90. Its purpose is to respond to various conditions, some static, some contingent on test outcomes, but all defined programmatically, that indicate which one or more DUT's, among as many as four thereof, are to be disabled. These indications are carried by four signals DD 0:3 44*b* (DUT Disable for DUT Zero, for DUT One, etc.) This is in support of multi-DUT testing on a Test Site. The output of Circuit 40 is an up to sixty-four bit vector 44*a* that, along with the DUT Disable signals 44*b*, is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_ UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance (among the various Test Sites) of Pin Electronics 9 receives Transmitted & Received Vectors 7 and Pin Electronics configuration information 8 from its associated Timing/Formatting & Comparison circuit 52.

The Timing/Formatting & Comparison circuit 52 is coupled to the VT Bus 89 to receive configuration and control information. It will be recalled that the Timing/ Formatting & Comparison circuit 52 is actually eight IC's, which for our purposes we are treating as a single entity.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54, but is locally addressed by an incremented counter that is not shown.) The Internal SRAM 54 (or external DRAM 53) assists in the production of Drive and Comparison cycles, which have associated formats. Drive cycles apply a transmit vector to the DUT using a pre-selected format supplied by one of RAM's 54 or 53. Comparison cycles receive a vector presented by the DUT and examine it, also according to a pre-selected RAM-supplied format, to determine if it matches previously supplied comparison data. Both Drive and Comparison cycles are adjustable as to their duration, and appropriately adjustable as to whether and when a load is applied, when data is latched or strobed, if a signal is Return-To-Zero or not, whether to surround a driven signal with its complement, etc. (These options are the various formats mentioned above.)

The comparison produced by the Timing/Formatting & Comparison circuit 52 includes information, on a per channel basis, about whether a channel failed because a logical value was wrong (a functional error) and/or because its electrical properties are outside acceptable limits (a parametric error). Furthermore, when multiple DUT testing is performed it is known which channels are associated with which DUT's. This allows the production of the four signals DFE 0:3 (DUT # Functional Error) 103 and the four signals DPE 0:3 (DUT # Parametric Error) 104. These signals are identified to this level of refinement as part of a feature known as "multi-DUT" operation (many DUT's on a single Test Site), which is, so to speak, the opposite philosophical direction than our present interest, which is multiple Test Sites for a single DUT. The Memory Test System is eminently configurable, however, and as we go forward we shall simply refer to the notions of functional errors and parametric errors, with the appreciation that the channel assignments for the individual DFE signals and the manner of logically combining those DFE signals allows the production of signals that amount to "Test Site level" functional and parametric error signals.

The comparison performed by the Timing/Formatting & Comparison circuit 52 also produces a sixty-four bit value 56 that is applied to a Receive Vector Reverse Mapper/ Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60, and also to Error Catch RAM1 32A. At present, it is sufficient to say that the Post Decode circuit 60 can inspect via programmatic criteria both incoming error information 59 and error information previously stored in the Error Catch RAM1 32A to produce condensed and more readily interpretable error information which may then by stored back into the other Error Catch RAM2 32B via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/ Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

The above concludes an introductory discussion of the overall nature of the memory tester. With that as a point of departure, we now turn our attention to the issue of bonding two or more Test Site together to become a multi-Site Test Station, such as the two-Site Test Station 16 shown in FIG. 1.

Figure 3:
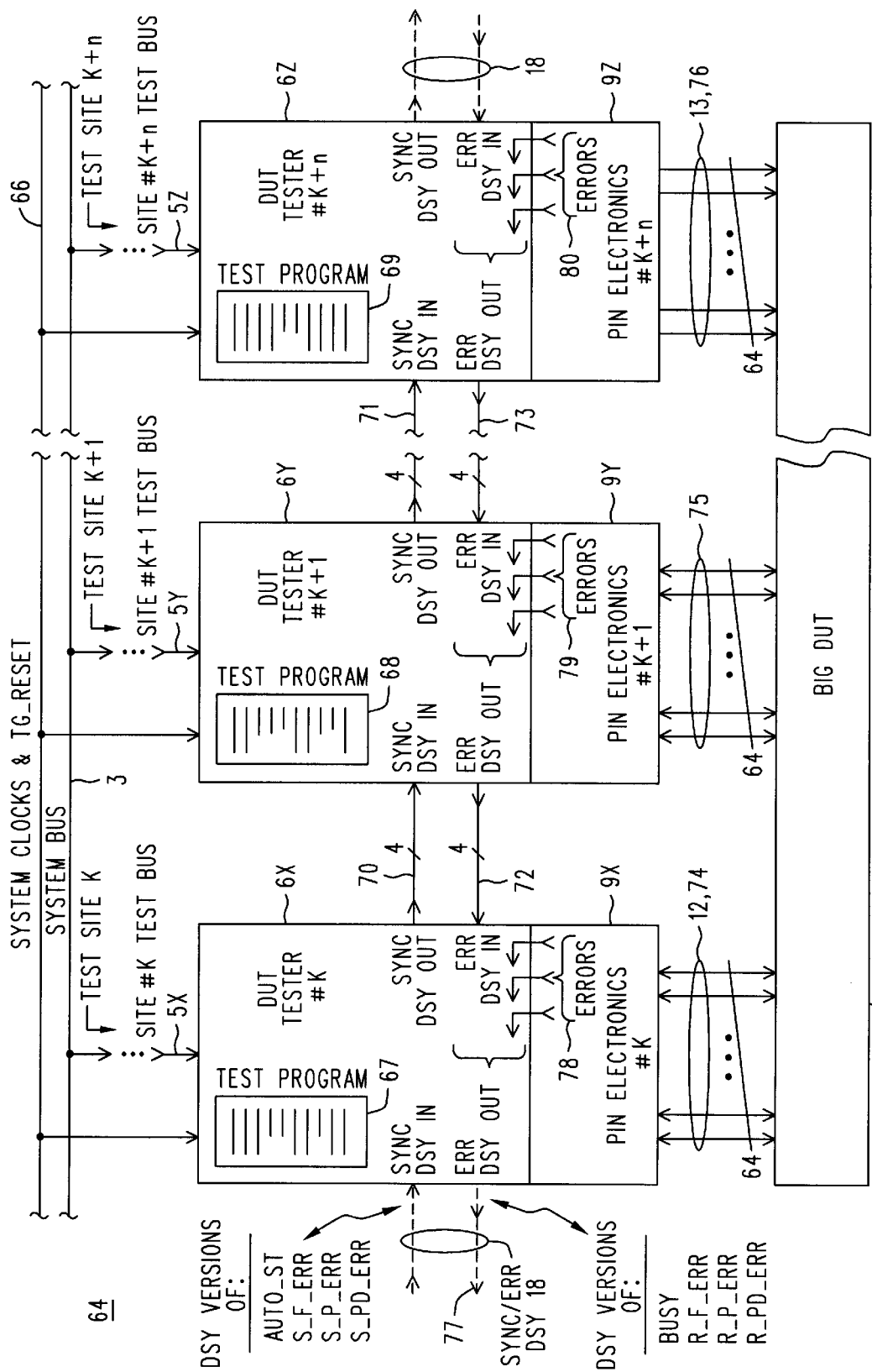
FIG. 3 is a simplified expansion of a portion of FIG. 1, useful in appreciating how Test Sites are bonded together to form Test Stations, and also in appreciating certain constraints on the test programs executed on those Test Sites.

Refer now to the block diagram 64 of FIG. 3, which is a simplified expansion of a portion of FIG. 1 (say, of part of the bottom half), useful in appreciating how Test Sites are bonded together to form Test Stations, and also in appreciating certain constraints on the test programs executed on those Test Sites. Note that a number of Test Sites (numbered k, k+1, . . . k+n) include respective DUT Testers 6x, 6y and 6z that in turn are each connected through their respectively associated Pin Electronics (9x, 9y and 9z) to a Big DUT (16, 65). The way the figure is drawn implies that there are at least four Test Sites bonded together to create one Test Station. It will, of course, be appreciated that the range of possible number of Test Sites to be bonded ranges from only two (as shown in FIG. 1) to as many as nine (the stay-within-the-card-cage limit mentioned earlier). Also implied by the figure is that, in an ordering of Test Sites within the card cage, Test Site k is not at the start of the ordering (because there are portions of the SYNC/ERR DSY 18 continuing to the left). Likewise there is an implication that Test Site k+n is not at the end of that ordering, since SYNC/ERR DSY 18 extends further to the right. It will be readily understood that neither of these implications are binding: Test Site k may or may not be at one end of the ordering, and Test Site k+n may or may not be at the other end. What we can say is that, since Test Site K is at "one end" of the DUT 65, Test Site K is at the start, top, or head, of a DSY (daisy chain), Test Site k+n is at the end, bottom or tail, while Test Site k+1 (and any other Test Site between k and k+n) is in the middle of that daisy chain.

As we continue, note also that the bi-directional SYNC/ERR DSY 18 has been split into two (directional) component parts: an ERR DSY (77, 72, 73) and a SYNC DSY (70, 71). The ERR DSY sends certain raw error information to the left in the figure, while the SYNC DSY sends corresponding synchronized error information (whose nature is described below) to the right. The source of the error information is the detection of what are called "functional" (logical) and "parametric" (a voltage, current or time is out of specification) errors. The detection of such errors is quite configurable (the details of which are beyond the scope of our present interest), and is performed on a Test Site by Test Site basis.

Test Site k can, if desired, "know" that it is at the top of a DSY, and thus not pass on to its left incoming raw error traffic via ERR DSY 77. (Such "knowing" is equivalent to the recognition that it is a Master, and to the "left" means to the next earlier {preceding} Test Site in the ordering thereof, while to the "right" means to the next later {successor} Test Site.) Test Sites k−2 and k−1 might form another daisy chain to the left of what is in FIG. 3, and even though they use the same constructs to do it, they constitute a separate daisy chain isolated from the one to the right (i.e., the one in the figure) The isolation can arise because Test Site k acts as a "Master" Test Site and can decline to pass on raw error traffic to the left. Another way for the desired isolation to arise is for the Test Site on the right to ignore traffic reaching it from the right. Similarly, a Master Test Site can ignore SYNC DSY traffic reaching it from the left, so that it is not, in principle, necessary for a Test Site to "know" that it is at the tail end of its DSY and then decline to pass SYNC DSY traffic to the right. (In one actual embodiment it does "know" and will not pass it on. But it could also be the case that a tail end Test Site does pass traffic to the right, and the Test Site to the right is either "asleep" and not part of any active DSY, or a Master that ignores it.)

To continue, then, each DUT Tester includes within itself a mechanism for executing a pattern belonging to a test program; to wit, the Micro-Controller Sequencer 19 of FIG. 2. Rather than show all that, we indicate within each DUT Tester a test program (67, 68, 69). Clearly, each Test Site needs to be in communication with some higher level of control to receive its test program (pattern) and be anointed as a Master. To this end, and consistent with what is shown in FIG. 1, each Test Site receives a corresponding Site #k Test Bus (5x, 5y, . . . 5z) that originates with a System Bus 3. A brief comparison with FIG. 1 will reveal that in FIG. 3 we have for the sake of brevity omitted a series of intervening Test Site Controllers. The System Bus uses a hierarchal addressing convention that includes Test Site addresses at the top with descending levels of abstraction identifying units within the Test Site. However, entities on the bus each know their complete address, rather than just their immediate location within the hierarchy. To create Site Test Bus traffic an (omitted) Test Site Controller REPLICATE's with un-truncated addresses the Bus traffic to or from its Site Test Bus. To continue with this, once inside the DUT Tester (see FIG. 2) the Site Test Bus is converted by the Multi-Bus Controller 88 to the Ring Bus 85. When detailed descriptions are offered, they are usually filled with many references to the Ring Bus, as it is used for many purposes, including configuration, communication of data, etc. So, in a certain logical sense, the System Bus, the various Site Test Busses and the many different instances of the Ring Bus are simply suitable operational extensions of one another.

There is one last bit of overhead that deserves mention before we proceed with our main task. Note that in addition to the System (Site Test) Bus, each DUT Tester is coupled to receive (66) some system clocks and a control signal called TGR (for Time Generator Reset). The situation is as follows. Each Test Site is a fairly complicated affair involving many different clock signals derived from one (or more) central source(s), say, a 400 MHZ master clock originating at one location for the entire Memory Test System. Within each Test Site there are many dividers and buffers to create the various working copies of the different clock signals needed to operate the system. If nothing were done to prevent it, these dividers would initially power up with arbitrary phase relationships between their outputs. That could pose potential problems for consistent and well defined internal operation of a single Test Site, but is most certainly a threat to any attempt to have all Test Sites operate in an identical fashion. For example, we ought to be able to expect that two Test Sites running, say, identical test programs, started at the same time, and on ideal DUT's will operate in manners that are indistinguishable from one another. But that won't happen if their locally generated clocks have arbitrary phase relationships. Accordingly, the TGR signal and its attendant mechanisms have been provided to force the dividers to be in specified states when they are released to run, so that all the respective clock signals in the different Test Sites are behaving in identical fashions. This enforced harmony can be ensured through a soft reset (i.e., without loss of power) upon the issuing of a suitable command by the Test System Controller 2 (see FIG. 1), say, at the behest of an operator that has become suspicious that it is needed, but is loath to actually cycle the power.

The mechanism that has been described in the preceding paragraph is conventional. However, we are going to give the TGR signal an extra task that is of interest to our invention. As will be described below, we are going to need to coordinate or synchronize the activities of a plurality of Test Sites based on the asynchronous occurrences of many different error signals. In a sense, we need an escapement mechanism whose outcome is common to all Test Sites, but that operates on quite disparate signals. Now, one could provide a single instance of such an escapement mechanism per daisy chain, and distribute its results as needed. This is, in principle, practical, but is not economical nor technically easy, especially in light of the desire to have Test Sites each contain only identical circuitry, and still support easy reconfiguration into whatever daisy chain configuration is appropriate. Escapements located in particular predetermined locations (say, on a motherboard in a card cage common to all Test Sites) will, at the signal frequencies of interest and considering the physical distances involved between Test Sites, encounter significant difficulties in matching propagation delays that will make ANY configuration an ugly business. And we haven't mentioned the troubles associated with the additional programmable rerouting of the signals to and from these fixed escapements that would be needed to support the notion of RECONFIGURATION. That said, how can TGR help us avoid these difficulties?

In short, the plan is to give each Test Site its own escapement, and then arrange for them to all operate in unison, in much the same way as the clock dividers were (initially) disciplined to operate identically. The mechanism that accomplishes this will involve a circular counter in each Test Site that is set by TGR to a known count and that, when TGR is released, begins to count a particular one of the clocks. We can assign one of the circular counter's count values (say, zero) as an index mark (or index signal) that will thus occur independently, but simultaneously(!), in each Test Site. Under the control of a Test Site operating as a Master at the head of a daisy chain (which any Test Site can be configured to do), these simultaneous index signals can be used to allow independent (but identical as to results) accumulation of asynchronous error signals and synchronization of operational outcomes based thereon. Roughly speaking, it works like this: Just after an instance of the index signal, a Master Test Site can inform the others in the DSY "get ready to do thus and so", whereupon at the next instance of their (simultaneous) individual index signals they each do as forewarned. Now, it will be clear that the size of the circular count need only be enough to allow time for set-up time and the worst case propagation delay. The propagation delay is a function of how many Test Sites are in the daisy chain. Because there are constraints on Test Site order in establishing daisy chains, it can be said with assurance that a two-Test Site DSY does not need the propagation delay of a nine-Test Site DSY. Accordingly, the size of the count used by the circular counters within a DSY can be adjusted to suit different lengths for that daisy chain. Henceforth, we shall refer to an instance of these circular counters as a Circular Index Counter, and its count will be named CIC (for Circular Index Count).

It was mentioned above that each of the Test Sites (6*x*, 6*y* and 6*z*) executes its own test program (67, 68, 69, respectively). Before proceeding further we should discuss certain aspects of this idea. To begin with, it will be appreciated that if the hardware of a single Test Site could handle the number of channels needed for a BIG DUT 65, then the situation would be conventional, and there would be just one test program being executed. A test program has the ability to determine, on a DUT cycle by DUT cycle basis, and for all channels, exactly what stimulus is applied and what response is to be expected. It can also branch based on received results. A single test program will only execute a single line of code at a time, and when it branches it does so "for the whole program," so to speak. This seemingly innocuous behavior turns out to be an important property when we consider how to emulate the notion of a BIG Test Site by combining several small ones.

The plan is to divide the programming task into units that are each respectively associated with the portion of the DUT that is connected to a corresponding Test Site, and then program those Test Sites with test programs that accomplish those programming tasks that resulted from the aforementioned division. Now, if there were no branching, and each component test program were simply a one-time linear sequence of tasks, say, m in number, then we would simply need to start all the component test programs in unison and execute them at exactly the same rate. A common clock to the various Test Sites ought to satisfy the common rate requirement, and we are confident that some way can be found to start them in unison, despite propagation delays that vary as a function of configuration. If we did these things, then we would have essentially lashed several vector machines together to synthesize a larger one. But a vector machine, even a BIG one, is not an algorithmic one, and if our plan is to work as intended, we need to preserve the algorithmic properties found in a regular "small" Test Site.

The difficulty is what to do about branching. (Which is to say, how should the logic/algorithmic control be exercised within a suite of separate test programs executing simultaneously?) Clearly, it is advisable to avoid a situation where each test program has its own (arbitrary?) logic and allows branching independently of conditions in the other test programs. That sort of thing might be permissible if the DUT were truly divisible into independent sections that could each be dealt with by a corresponding Test Site whose test program had an algorithm different from the others and customized for that section of the DUT. That situation is a typical (it would be more of an ASIC tester idea than a memory tester one), and is not why we have developed the Slave mode that is the subject of this disclosure. The usual case is that the DUT is not separable into truly independent component sections, and even though we are forced to divide the test program into a suite of test programs for execution upon several program execution mechanisms (each associated with a part of a BIG DUT), we want the underlying algorithm to remain undivided.

To achieve this, we equip the various Test Sites that are to be a part of a DSY with an error communication mechanism (the ERR DSY 77, 72, 73) so that each test program can inform the others, and can also in turn be informed by those others, of the occurrence of error conditions that will cause branching. Each test program is to be written to branch, sympathetically, as it were, in unison with all the other test programs in the same suite. That is, even though the error "occurred in a different test program" all test programs will honor it as if it were their own.

To aid in identifying issues relating to the test programs, we now sketch and then contrast some different scenarios pertaining to branching. First, suppose that only the test program that "really" experienced the error branched, while the others continued on unaffected. If this were legitimate, it would mean that the mechanism being tested by the branching test program is separate from that being tested by any other test program. This is essentially a more-than-one-DUT case that is not what we are primarily interested in at present. If the several DUT's were identical, it would amount to what is termed "multi-DUT" and it would mean that the multiple test programs are not required to combine to form a larger whole: there is no BIG DUT!

Now, there might be several "component DUT's" that are not identical, that cooperate for a larger purpose and that are all located within a single package. This would be a BIG DUT, and it might indeed be testable with individual test programs that are independent, and that only (and indirectly) form a larger whole through the interaction of their corresponding DUT's. In this scenario we might expect that one test program branches to say, an error routine, while the others idle (or do whatever) until it is time to resume coordinated test activity. The implication is that there is a mechanism controllable by one program to get the others to synchronously exit their idle loops at the conclusion of the error handling routine. This represents a very generalized architecture, that, while we admit it is possible, is not typical (or presently found at all) in the world of non-volatile FLASH memories. It also represents a direction that we are not presently pursuing, and we will not describe a scheme where one test program directly initiates branching in others.

That is, it is not going to be the case that test program "A" tests this part of the DUT, while an unrelated (and different) test program "B" tests another part of the DUT. Instead, what interests us at present is the case where the mechanism (DUT) to be tested is TOO BIG for one test program and its associated resources (number of channels) to handle. The testing is not separable into independent component activities performed simultaneously, but must instead be viewed as a unified activity distributed among multiple program execution mechanisms that combine to create a larger whole. In this view, when an error in the DUT's operation occurs each test program has a part to play, and branches to its error routine (some of which, it is true, may not need to do anything except mark time). Those individual error routines combine to form a larger error routine, just as the "regular" programming combines to form something larger than its individual pieces. The programmer is expected to ensure that each of these individual error routine are of the same length, so that they each, automatically as it were, rejoin the main thread of DUT testing without the need for one test program to signal the others. Another way to think of it is that each of the test programs has something to do as part of the error routine (e.g., address generation), and whatever that is keeps them synchronously busy, just as if there had been no error, and that (typically) none of the test programs are at liberty to be "on the loose" (idling) while another one of them takes care of the error. This latter view is what the reader should have in mind when contemplating the test program segments 67, 68 and 69 in FIG. 3.

Figure 4:
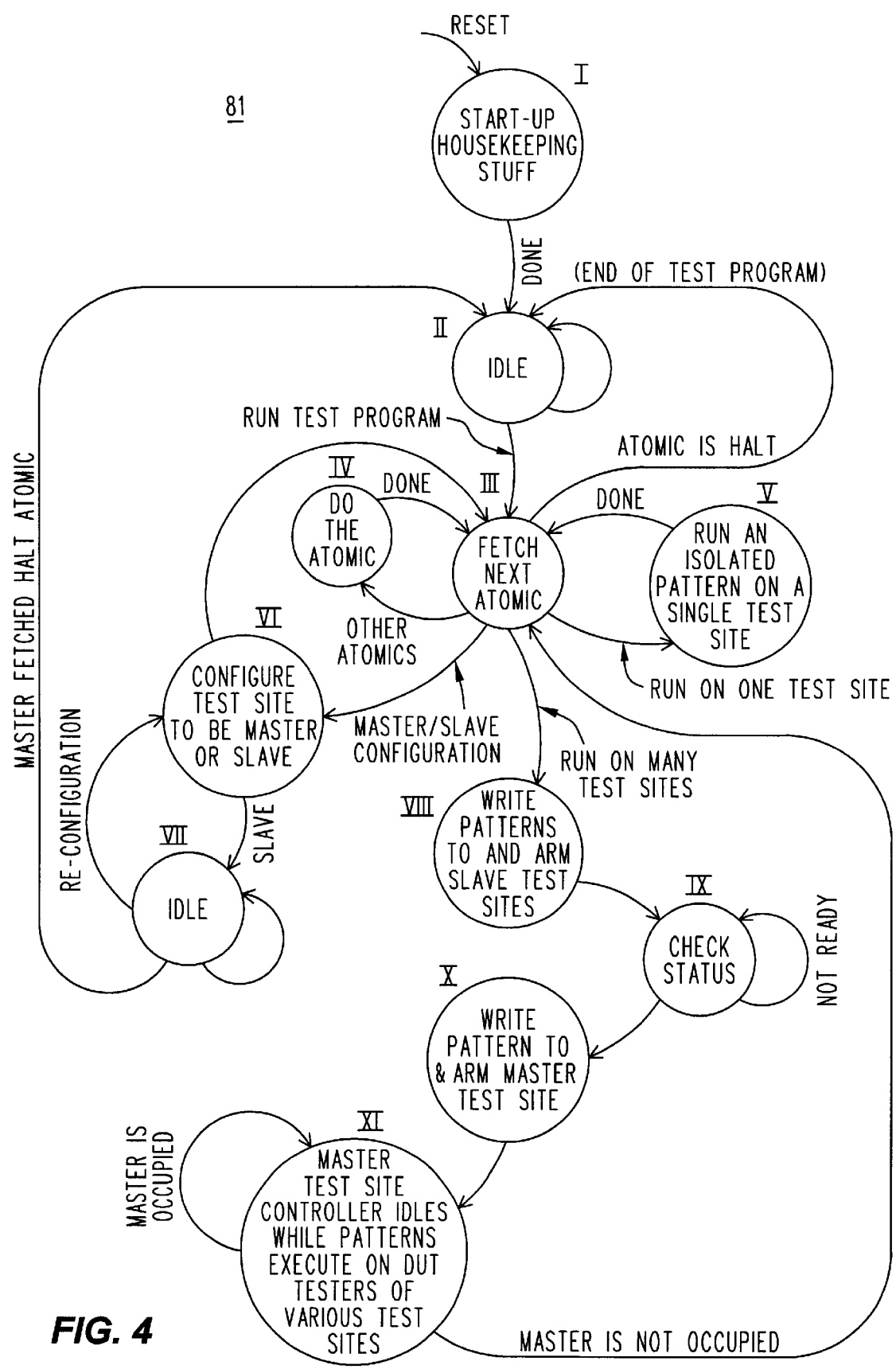
FIG. 4 is a state diagram describing an overview of Test Site activity for the testing of BIG DUT's by Test Stations.

Refer now to FIG. 4, which is a (slightly simplified) state diagram 81 describing those portions of Test Site Controller activity that are of interest to us during the testing of BIG DUT's using Test Sites that have been configured as a Master and associated Slaves. The state diagram 81 applies to each Test Site Controller 4a–z in the Memory Tester, whether configured as a Master, Slave, or as an "ordinary" Test Site Controller.

Upon turn-on or a system reset there is a transition to State I, where various housekeeping tasks are performed, such as self-test diagnostics and automatic calibration. At the conclusion of those tasks there is a transition to State II, which is an idle state in which the Test Site Controller remains until it is instructed to run a test program. At that time there is a transition to State III: FETCH NEXT ATOMIC.

We now digress briefly to discuss the notion of an "atomic" operation. To this point in this application (and also in those incorporated by reference) we have often indulged in a convenient fiction that there is a complete unitary "test program" that can be executed by a DUT Tester (6a–z). Specifically, that the Micro-Controller Sequencer 19 (of FIG. 2, and occasionally referred to as the APG, or Automatic Pattern Generator) would "run a pattern" whose activity constituted the test program. It will be recalled that a pattern is a sequence of transmit and receive vectors. In reality, and despite the fact that a pattern might be, say, over a million vectors in length, a pattern is typically but a "step" in an entire test program. As sophisticated as the APG is (it certainly fits the description "a computer on a chip"), it is still generally not capable of containing an entire test program, nor is it necessarily desirable that it be able to.

Think of a pattern as an algorithmically implemented test tool that checks a particular aspect of DUT operation. To check all the aspects of operation requires many different tools. Furthermore, there may be "connective tissue" between applications of tools (patterns) that are not themselves actual stimulus/response type activity applied to the DUT (e.g., connect a power supply to certain channels, or change a threshold voltage). These things are correctly thought of as being part of the test program, even though they are not part of a sequence of transmit and receive vectors generated algorithmically by the Micro-Controller Sequencer 19.

This scheme of things is accomplished by an i960 processor (not shown) in the Test Site Controller that executes code written in the C programming language. An "atomic" is essentially a procedure written in C. Most of these procedures are members of a library provided by the manufacturer of the Memory Tester, and do useful sub-tasks from which larger component tasks can be created. Some of these sub-tasks are not directly implemented by the APG, while some are. For example, there is an atomic that causes a named pattern to be obtained (from the Test System Controller 2 or some mass storage device) and loaded for execution into the Micro-Controller Sequencer 19. Atomics can also be used to perform configuration within and between Test Site Controllers. Thus, a more complete understanding of the notion of "test program" is that it consists of a series of atomic operations that are fetched and executed by the i960 in the Test Site Controller. "Executed" in the previous sentence means either that the i960 does the atomic itself or that it passes the activity referred to by the atomic on to another mechanism (the APG in the DUT Tester) that actually executes it.

To resume our explanation, then, State III fetches the next atomic. If it is one that can be performed directly by the Test Site Controller, then State IV does so. The atomic might be one that is to cause ordinary execution of a pattern on a single Test Site, without benefit of the notion of Master and Slave Test Sites. State V deals with that situation. The fetched atomic might be a HALT that serves to terminate a test program (ala STOP or END statements in some programming languages). In that case, State III transitions back to State II to resume idling until another test program is run.

The two circumstances that interest us the most are these: Configuration into Master and Slave Test Sites and running a test program for a BIG DUT. State VI deals with the former case, and represents the activity needed to create the needed DSY's (daisy chains). If a Test Site Controller has configured itself to be a Master, then State VI transitions back to State III, in anticipation of fetching another atomic that will lead to State VIII. If, on the other hand, a Test Site Controller configures itself to be a Slave, then it essentially goes to sleep by a transition to state VII, where it idles until either it is told to reconfigure itself again (it is not so asleep that it ignores all bus traffic sent to it) or a monitored status register indicates that the Master Test Site Controller has fetched a HALT atomic, in which case IDLE State VII transitions to IDLE State III. (It is the Site Controller's state machine for FIG. 4 that "goes to sleep" and not the Test Site as a whole. The DUT Tester portion of a Slave Test Site is very much awake, and will execute its portion of the test program.)

The transition from State III to State V is shown for completeness, even though it does not especially interest us. State V represents the conventional execution of a pattern on a single Test Site.

State VIII will only be reached by a Master Test Site Controller that is preparing to begin execution of a test program for a BIG DUT. It is at State VIII (of the Master's state machine) that the patterns for any Slaves are sent to those Slaves (otherwise idling in State VII of their state diagrams), and also there that those Slaves are armed. State IX is a wait loop that delays a transition into State X until all Slaves report that they are armed. When they are all armed State X writes the pattern for the Master into its DUT Tester (APG), and arms it, also. Once all the Test Site Controllers are all armed, the next instance of the index mark from the Circular Index Counter synchronously sets all DUT Testers into execution of their patterns.

Once that is accomplished, the Master Test Site Controller can now idle in State XI, while the various DUT Testers are "OCCUPIED" running their respective patterns. The Master Test Site Controller is also OCCUPIED, even though all it is doing is idling in State IX (the Slaves are idling in State VI). When the Master Test Site Controller's DUT Tester fetches a QUIT PATTERN instruction in its pattern, a status register will indicate this, which is in turn taken as an indication that the Master Test Site Controller is no longer OCCUPIED. When that happens State XI transitions back to State III to fetch another atomic.

Figure 5:
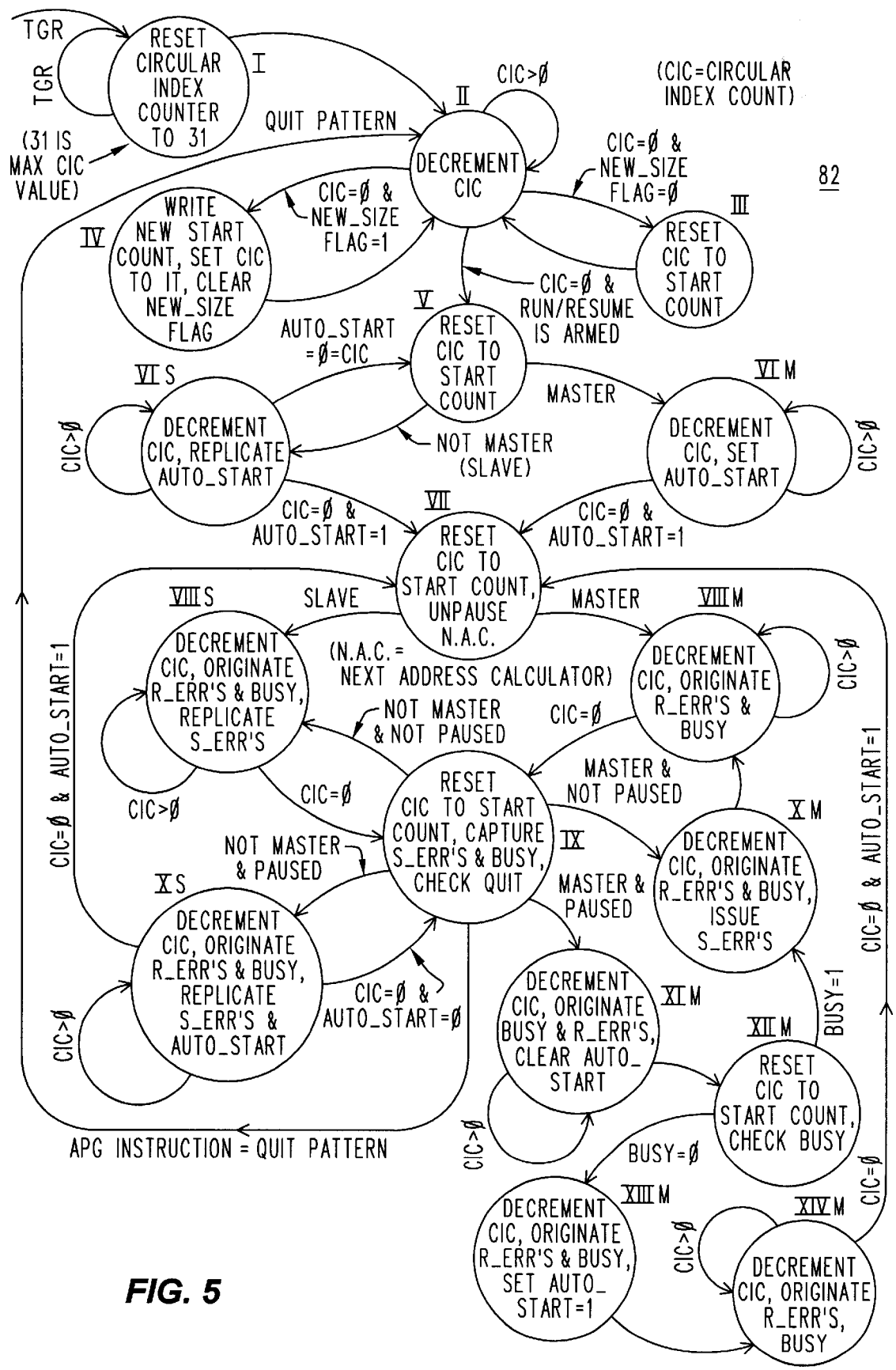
FIG. 5 is a state diagram describing in some detail the activities of Master and Slave Test Site Controllers (DUT Testers) during operation as a Test Station for the testing of BIG DUT's.

Now refer to FIG. 5, which is a state diagram 82 of the behavior within each DUT Tester that is configured either as a Master or a Slave; the same state diagram does both, even though different behaviors are sometimes needed for the different cases. As in FIG. 4, states are denoted with capital roman numerals. Those that have a suffix of S are ones used exclusively by Slaves, while those with a suffix of M are used by only a Master. States without suffixes are common to both. Whether a DUT Tester is Slave or a Master, it runs its own copy of the state diagram 82 shown in FIG. 5.

Either during turn-on or a system reset, the signal TGR is issued. This forces State I and resets the value of the Circular Index Counter (CIC) to its maximum possible value of, say, thirty-one. When TGR is no longer asserted State I transitions to State II.

State II is essentially the "top of the loop" for the state diagram 82 as a whole, and what it does is idle while decrementing CIC down to zero. When CIC gets to zero State II determines which of three transitions to make. Two of those decisions involve a NEW_SIZE flag (a bit in a status register) that when set indicates that a new circular count size is desired for operation of the CIC mechanism. In such a case State IV writes the new operational value (which is found in an associated register NEW_START_COUNT) into a register START_COUNT, sets CIC equal to START_COUNT, clears the NEW_SIZE flag and transitions back to State II. In the corresponding case where CIC is decremented to zero but the NEW_SIZE flag is not set, State II transitions to State III, where CIC is simply set to START_COUNT and a transition is made back to State II.

The third transition is from State II is to State V, and occurs when CIC is zero and either RUN or RESUME is armed. The difference between RUN and RESUME is minor (both mean "get going", or perhaps "UN-QUIT" or "UN-PAUSE"), and in any event are outcomes of States VIII and X of the state diagram 81 of FIG. 4. Arrival in State V represents the first step in the process of getting the Master and Slave Test Sites to commence simultaneous executions of their respective patterns.

It will be noted that there are not enough transitions out of State II to account for all the apparent combinations. This is accounted for by the NEW_SIZE flag and the RUN/RESUME operations being mutually exclusive. The setting of the NEW_SIZE flag and the arming of RUN and RESUME are each accomplished by the execution of a respectively associated "atomic" at State IV of FIG. 4. Those atomics are processed one at a time; hence the mutual exclusivity. It also indicates that the setting of NEW_SIZE flag would occur before RUN or RESUME.

What State V does is to reset CIC to the value in START_COUNT, and then transition to State VI S for a Test Site that is a Slave, and to State VI M for a Test Site that is a Master. State VI M is the simpler case, so let's consider it first. What it does is set to ONE a signal called AUTO_START and then idle while decrementing CIC until it is zero. The idea is to get AUTO_START asserted at the very start of the decrement process, so as to provide a maximal amount of time for it to propagate through the daisy chain. What AUTO_START does is tell the Test Sites in the daisy chain to commence pattern execution upon the next instance of the individual CIC's becoming zero (which although independent, occurs simultaneously). When CIC does get to zero State VI M transitions to State VII (where pattern execution begins). Now for State VI S. It also idles while decrementing CIC. It also receives the value of AUTO_START from the preceding Test Site in the daisy chain and REPLICATE's it for (passes it along to) the next Test Site in the daisy chain. Now, AUTO_START could be either a one or a zero at the time CIC reaches zero. It could be a zero because this Slave Test Site was armed, but the associated Master has not yet been armed (note that in FIG. 4 State VIII occurs before State X). In that case State VI S transitions back to State V, which immediately transitions back to State VI S. This will go on until the associated Master Test Site does issue AUTO_START (via its State VI M in FIG. 5) and State VI S transitions to State VII. NOTE THAT ALL TEST SITES WILL REACH THEIR RESPECTIVE INSTANCES OF STATE VII SIMULTANEOUSLY.

What State VII does is reset CIC to the value in START_COUNT and commence the pattern execution process by "un-pausing" the Next Address Calculator 102 in the Micro-Controller Sequencer 19. Each state diagram (one per Test Site) does this for its respective DUT Tester/APG, and does so in a definite manner following arrival in State VII, so as to ensure that all patterns begin their execution in unison. State VII will then transition to State VIII S for a Slave and to State VIII M for a Master. The balance of the state diagram 82 deals with creating in-unison responses to exceptions (the various raw errors or BUSY) that occur asynchronously in any one of the Test Sites in the daisy chain.

State VIII M is perhaps slightly simpler, so let's begin with it. What it does is idle while decrementing CIC, meanwhile originating any raw error signal or a signal called BUSY. We use the term "originate" to means that the desired value for the signal referred to is determined as the logical OR of an internally desired value (by the present Test Site Controller) and the incoming value from the (Slave) Test Site Controller just down stream in the daisy chain. That determined value (the "OR'ing") then becomes the value that is driven upstream for the daisy chain, or if there is no further upstream (i.e., for a Master), the determined value is the value used by that Master in its operation. "Originate" does not automatically mean "SET" and the driven originated value could be either SET or CLEAR, TRUE or FALSE.

The error signals for which this origination process applies are collectively called R_ERR's (for Raw Errors), and consists of signals (going upstream) representing Functional Errors (R_F_ERR), Parametric Errors (R_P_ERR) and Post Decode Error (R_PD_ERR). Each Test Site has its own instances of these R_ERR's. They are called "Raw" because the propagation delay between Test Sites still applies to them. They still need to be sanitized—their recognition made synchronous across all Test Sites in the daisy chain. That's another job for the detection that CIC has gone to zero, which, when it happens, causes a transition to State IX.

BUSY is another going-upstream signal that is subject to the originate process described above. BUSY is not, however, indicative of an error, and is instead associated with ending a PAUSE (i.e., doing a RESUME). That is, rather than BUSY being a signal that will cause (in State IX) each APG to PAUSE in its execution of its pattern, it instead indicates that its APG is/has executed an instruction needing a PAUSE. Each APG knows to initiate that PAUSE when it executes such an instruction, so that BUSY does not "cause" a PAUSE itself, and instead indicates to other APG's that somebody is (still) PAUSE'd. These PAUSES's will begin in unison (owing to synchronization of instruction fetching and a requirement that each Test Site's program have PAUSE producing instructions in the same respective place). What BUSY is really for, then, is to indicate by its going away (no Test Site continues to assert it) that all Test Sites are to RESUME execution on the next instance of CIC going to zero.

The notion of a PAUSE is needed to allow time for an instruction in a pattern to achieve an effect that takes longer to produce than one instruction cycle time. There is a wide range of possibilities here, and a useful example would be one Test Site requesting over the bus that another Test Site change voltage thresholds for certain channels. Rather than insert preselected fixed delays into each Test Site's test program segment, (which is risky unless we are absolutely sure how long the wait will be, and wasteful if it is longer than needed), we use the PAUSE construct, which is an open-ended, resume-when ready type of operation. A PAUSE is ended ("UN-PAUSED" or execution RESUME'd) in essentially the same synchronous manner that execution was begun in State VII. That is, with a transition from some State (XIV M) to another State (VII) when CIC equals zero. More immediately, the transition from State VIII M to State IX when CIC equals zero will synchronize the detection of a BUSY originated in State VIII M (or similarly for a BUSY and transition from State VIII S, too), so that all Test Sites in the daisy chain will synchronously initiate a PAUSE upon entry into State IX. (That is, it is a requirement that the test program instructions, at those respective locations in each test program, each be an instruction that generates at least a minimal length BUSY.) Of course, BUSY may be zero upon the transition from State VIII M to State IX. This corresponds to a Master's continued execution, and we need an idle loop to accommodate that. That idle loop will be a transition to State X M, and from there back to State VIII M. State X M will decrement CIC and originate any raw errors and BUSY. It also ISSUE's any S_ERR's. A Master ISSUE's an S_ERR signal when it is in STATE X M (or as we'll see below, State XIII M) and the associated R_ERR signal is detected coming from down stream by that Master, or it decides to assert it as a result of its own Test Site operation. It is the occurrence of an S_ERR signal that actually causes the test programs to branch, as will be described shortly. The Master's program execution idle loop is closed by a transition from State VIII M back to State IX.

Now suppose that BUSY was set upon the transition into State IX. That transition will PAUSE the Next Address Calculator for the Test Site. A Master will then transition from State IX to State XI M, which decrements CIC, originates any raw errors and BUSY, as well as clearing AUTO_START. Since we are PAUSE'd, a re-start will be needed and a fresh onset of AUTO_START will be needed, it has to first be cleared (there can't be an onset of a signal that is already present). We now idle in State XI M until CIC has been decremented to zero, whereupon there is a transition to State XII M. At State XII M the value of CIC is reset to its start count, and BUSY is checked. If it is still set then there is a transition to State X M, and we have another idle loop (VIII M, IX, XI M, and XII M) while the BUSY induced PAUSE is in effect.

On the other hand, State XII M will transition to State XIII M when BUSY is finally zero. Here CIC is decremented, raw errors are originated, and AUTO_START is set to ONE. The setting of AUTO_START to ONE (its onset) is an alert to all items on the daisy chain that the next instance of CIC going to zero is a RESUME (or UN-PAUSE). State XIII M also ISSUES (as defined above in connection with State X M) any needed S_ERR signals. The machine now transitions to State XIV M, where CIC is decremented until it is zero (meanwhile originating raw errors and BUSY). When CIC gets to zero there is a transition back to State VII, where there occurs a synchronous RESUME.

Now, let us return to State VII and cover the somewhat simpler case of what a Slave does. Recall that when State VII is reached CIC is a zero and AUTO_START is a ONE. We now appreciate that this means that something is to happen when CIC next gets to zero. State VIII will be the reason that CIC will get to zero, and in the slave case the transition from State VII is to State VIII S (instead of to State VIII M as explained earlier for the case of a Master). State VIII S does everything that State VIII M does (decrement CIC, ORIGINATE R_ERR's and BUSY, and in addition REPLICATE's S_ERR's. To REPLICATE a signal is to repeat it (send it on) to the next Test Site Controller down stream in the daisy chain. It will be recalled that an S_ERR signal is ISSUE'd (in the down stream direction by a Master in States X M or XIII M ) when its corresponding R_ERR signal is either generated by or is sent to the Master Test Site Controller in the daisy chain. Each Slave Test Site Controller REPLICATE's S_ERR signals reaching it (when they are in State VIII S or, as described soon, in X S). State VIII S is an idle state while waiting for CIC to reach zero. It is that wait that allows time for the consecutive REPLICATE operations down the daisy chain. Of course, CIC will eventually reach zero, and there will be a transition from State VIII S to State IX.

State IX was not fully described earlier, and it is now appropriate to say a bit more about it. What happens in State IX is that the value of the count in CIC is reset to its starting value (already mentioned). There is also other activity in State IX: CAPTURE the various S_ERR's, and BUSY. The idea of CAPTURE is that a signal like BUSY or one of the S_ERR's can arrive at a Test Site Controller some time prior to entry into State IX, and that there are other states that are going to perform actions based on the values of those signals. The CAPTURE operation samples the values of the signals of interest at the time of State IX (and retains those sampled values). It is the CAPTURE'd values that are used to influence subsequent events. State IX also checks a signal called QUIT that is the output of a latch set when the program executes a QUIT PATTERN instruction. If QUIT is set it supersedes other conditions in State IX and forces a transition way back up to State II, to await the beginning of another pattern.

For a Slave there are two possible (non-QUIT) transitions out of State IX. These are back to State VIII S if that Slave is not PAUSE'd, and to State X S if it is. The State IX–VIII S combination is an idle loop for the execution of test program instructions that do not induce a PAUSE. Those that do induce a PAUSE cause the second transition mentioned above: to State X S. It does the exact same thing as State VIII S except that it also REPLICATE's AUTO_START. The transitions from State X S are to State IX when CIC is zero and AUTO_START is also zero (another idle loop, but now it is for awaiting the end of the PAUSE, as indicated by AUTO_START becoming a ONE), and, back to State VII when CIC gets to zero and AUTO_START is finally a ONE. It is at State VII that program execution (for all Test Sites) will RESUME.

It will be noted that the state diagram 82 shows R_ERR's and S_ERR's being asserted; but says nothing about the removal of such assertion. These R_ERR and S_ERR signals will persist once set. The test program has available (program) instructions that will clear these various error indications. It is part of the test program's responsibility to not accidentally branch on a previously used error flag without having cleared it at the conclusion of its previous use.

And what of the various errors: R_ERR's that eventually cause corresponding S_ERR's ? We have throughly discussed BUSY, but have not really described in full the process of branching on errors. We now fix that. As far as a test program is concerned, a branch on an error (represented by a corresponding S_ERR signal being a ONE) occurs in the usual way when that program executes a branching instruction that is conditioned on that signal. Those branching instructions are each in respectively corresponding locations in their test programs, and are executed simultaneously as a normal matter of fact, since a major property of the state diagram 82 is to keep in unison the execution of the instructions at the corresponding program locations of the various test programs. As for there being two States X M and XIII M that ISSUE S_ERR's, the difference between the two is accounted for by whether or not there was a PAUSE in effect or not, or just ending, at the time the S_ERR signal is to be ISSUE'd. In each case, the state diagram 82 arranges that there be the maximum period of count down for CIC to allow all Test Sites to be prepared to simultaneously construe the (synchronized) error signal (which will also be CAPTURE'd in State IX) when CIC next goes to zero. So as far as the test program is concerned, it executes an instruction that branches on one of the ERR conditions, and that is all, save for subsequently resetting that error indication before using it for another part of the test. Remember that all test programs execute their respective instructions in unison, and that, owing to the mechanism described in connection with the state diagram 82, each test program's execution hardware gets the S_ERR signals in unison, also.

It will, upon reflection, be appreciated that the mechanism just described is capable of allowing a test program executing upon the DUT Tester for one Test Site to alter underlying conditions for channels being tested by a different DUT Tester within another Test Site. An example of this is the ability to change voltage thresholds. That is, the execution of such an instruction by a first DUT Tester causes it to PAUSE (signaled by BUSY), while all the other DUT Tester's test programs also have at that same test program location some PAUSE-producing instruction (as previously explained). The commands to change, say voltage thresholds, can then originate from the first DUT Tester (as part of executing the PAUSE-producing instruction) and be directed to other Test Sites over either the System Bus 3 or the CMD/DAT DSY 17 (see FIG. 1). As previously explained, when all Test Sites have agreed that the PAUSE should end, all the BUSY's will have been released and program execution begins again. The point is that control over certain "environmental" parameters for all channels under test can be centralized in one test program, and it is not be the case that each test program is restricted to such control over only its "own" channels.

Figure 6:
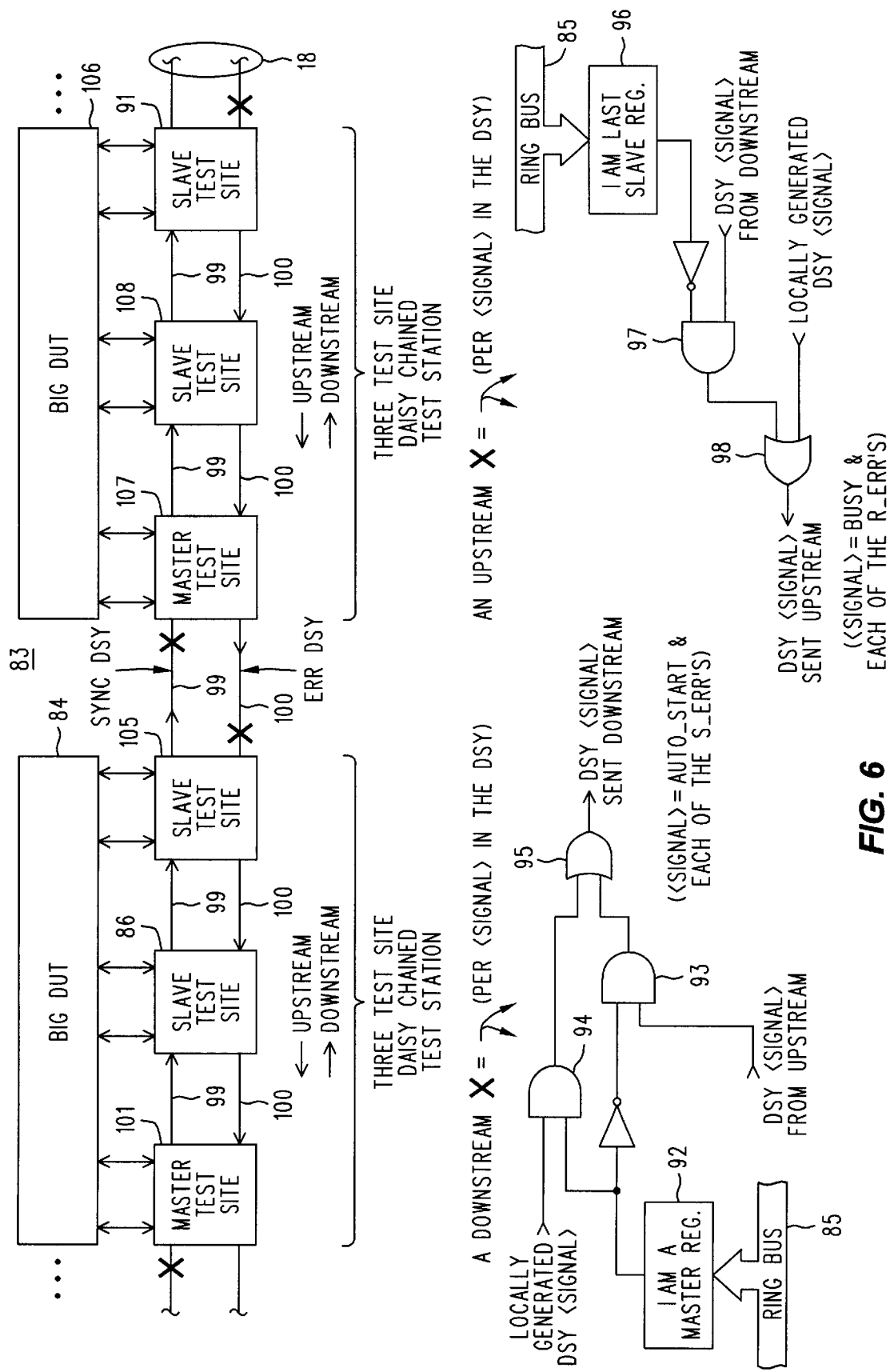
FIG. 6 is a simplified block diagram of a portion of a Test Site Controller useful in appreciating how bonded Test Sites behaving as a Test Station delimit daisy chain signals so that several Test Stations of configurable size can share the same set of DSY signals.

Refer now to FIG. 6, wherein is shown a simplified block diagram 83 illustrating how the SYNC DSY 99 and ERR DSY 100 can be configured into segments of selected lengths in support of bonding Test Sites into Test Stations for the testing of BIG DUT's. The top half of FIG. 6 shows two instances of such bonding, and is reminiscent of FIG. 3, where only one such instance is shown. In particular, FIG. 6 shows two BIG DUT's 84 and 106 that are each tested by Test Stations that are composed of three (consecutive along the daisy chain) Test Sites daisy chained ("bonded") together. That is, a Master Test Site 101 and two Slave Test Sites 86 and 105 form one Test Station for testing BIG DUT 84, while a Master Test Site 107 and Slave Test Sites 108 and 91 form another Test Station for testing BIG DUT 106. The topic of greatest interest in FIG. 6 is the configurability of this arrangement, while both Test Stations (i.e., all the Test Sites) are electrically connected to the same daisy chains. That is, each is in turn connected to the SYNC DSY 99 and the ERR DSY 100. In the example of the figure, each of BIG DUT's 84 and 106 are three Test Sites wide. This is reasonable, but need not always be the case. They might both be either two or perhaps four Test Sites wide. Likewise, one might be two wide while the other is four wide, and so on. There needs to be a way to create these adjustable length DSY segments.

Specifically, note that: BIG DUT 84 is tested by Master 101 and Slaves 86 and 105; BIG DUT 106 is tested by Master 107 and Slaves 108 and 91; and that SYNC DSY 99 and ERR DSY 100 are shown as interrupted by a heavy X's between Slave 105 and Master 107. Note also that there are two other such heavy X's denoting similar interruptions: one on the SYNC DSY to left of Master 101 and one on the ERR DSY to the right of Slave 91. What we are indicating here is that a Master ignores SYNC DSY traffic from further upstream (if such there be) while a Slave that is at the end of a daisy chain declines to send traffic further down stream (whether or not there is yet another down stream Test Site). The bottom half of FIG. 6 describe the nature of the circuitry that is used to accomplish this selectable length DSY operation.

Each Test Site Controller includes a register 92 whose content, when set via the Ring Bus 85 in accordance with software controlled configuration, indicates that the Test Site is a Master. When that register is set an inverter prevents an AND gate 93 from passing along an upstream SYNC DSY signal. If the register 92 is not set, then a SYNC DSY signal will be passed along. Similarly, an AND gate 94 requires that register 92 be set allow a locally generated (i.e., by that Test Site itself) SYNC DSY signal to be passed downstream. The outputs of AND gates 93 and 94 are OR'ed together by OR gate 95 and form the version of the SYNC DSY signal that is sent down stream. In the figure the notation <SIGNAL> is used as a place holder for any of the signals in the SYNC DSY for which the above mechanism is applicable. Those are the signals AUTO_START and each of the S_ERR signals. It will be understood that the circuit of register 92 and gates 93–95 is repeated for each of those signals, and that we have for the sake of brevity shown only one un-named instance of it.

A similar collection of circuits composed of register 96 and gates 97 and 98 shows how a Slave designated as the last one in the DSY (tail end Slave) declines to accept ERR DSY signals from further down stream. There is one collection of such circuitry for each <SIGNAL> in the ERR DSY, where <SIGNAL> represents each of BUSY and the R_ERR signals.

Finally, it will be appreciated that each Test Controller has the state machines and logic circuitry needed to accept configuration as Master or Slave and to implement the behavior of FIGS. 4, 5 and 6. The state machines (not explicitly shown) are part of the APG.

We claim:

1. A method of producing in concurrently executing separate programs synchronized responses in those separate programs to an event signal having different propagation delays from its origin to each of respective environments within which each separate program executes, the method comprising the steps of:
   (a) executing each separate program on a respectively separate processor, each of which is located within an associated respective electrical environment;
   (b) operating corresponding separate counters within the electrical environment for each processor, one value among the counts of which serves as an index signal for the respective electrical environments containing the counters, the counters each operating at the same clock frequency and each having previously been started in unison with a common starting count subsequent to a preceding occurrence of the index signal associated with each counter;
   (c) serially propagating an event signal from the electrical environment of one separate processor to another in accordance with an ordering among the separate processors, the serial propagation being in a first direction along the ordering;
   (d) in response to the event signal reaching a most distal electrical environment along the ordering in the first direction, generating therein a response signal subsequent to an instance of the index signal for that most distal electrical environment;
   (e) serially propagating the response signal, from its origin in the most distal electrical environment along the ordering in the first direction, to each of the other electrical environments, this instance of serial propagation being in a direction along the ordering opposite to that of the first direction of step (c); and
   (f) within each electrical environment, responding to the response signal upon the next instance of the index signal from the counter within that electrical environment.

2. A method as in claim 1 wherein step (a) further comprises the steps of operating the respective separate processors with in-phase instances of a common clock frequency, and the responding of step (f) is simultaneous among the respective separate processors.

3. A method as in claim 2 wherein the response of step (f) is the execution of a branching instruction within each separate program.

4. A method as in claim 2 wherein the propagation in step (c) of the event signal is delayed by an electrical environment until an ongoing operation therein is concluded, and the response of step (f) is the resumption of program execution for the separate programs.

5. A method as in claim 1 wherein the counters count down from a selectable starting value and the one value among the counts that serves as the index signal is zero.

6. A method as in claim 1 wherein the separate programs are executed upon test sites within a memory tester for testing a memory that requires more signals than there are channels within a test site.

7. A method of simultaneously commencing execution in concurrent separate programs in response to a start signal having different propagation delays from its origin to each of respective environments within which each separate program executes, the method comprising the steps of:
   (a) loading each separate program into the program memory for a respectively separate processor, each of which is located within an associated respective electrical environment and is operated with in-phase instances of a common clock frequency;
   (b) operating corresponding separate counters within the electrical environment for each processor, one value among the counts of which serves as an index signal for the respective electrical environments containing the counters, the counters each operating at the same clock frequency and each having previously been started in unison with a common starting count subsequent to a preceding occurrence of the index signal associated with each counter;
   (c) serially propagating an arming signal from the electrical environment of one separate processor to another in accordance with an ordering among the separate processors, the serial propagation being in a first direction along the ordering;
   (d) in response to the arming signal reaching a most distal electrical environment along the ordering in the first direction, generating therein a start signal subsequent to an instance of the index signal for that most distal electrical environment;
   (e) serially propagating the start signal, from its origin in the most distal electrical environment along the ordering in the first direction, to each of the other electrical environments, this instance of serial propagation being in a direction along the ordering opposite to that of the first direction of step (c); and
   (f) within each electrical environment, responding to the start signal upon the next instance of the index signal from the counter within that electrical environment by commencing program execution.

8. A method as in claim 7 wherein the counters count down from a selectable starting value and the one value among the counts that serves as the index signal is zero.

9. A method as in claim 7 wherein the separate programs are executed upon test sites within a memory tester for testing a memory that requires more signals than there are channels within a test site.

* * * * *